United States Patent
Hong et al.

(10) Patent No.: US 7,945,769 B2
(45) Date of Patent: May 17, 2011

(54) SINGLE SYSTEM BOARD WITH AUTOMATIC FEATURE SELECTION BASED ON INSTALLED CONFIGURATION SELECTION UNIT

(75) Inventors: Chang-Hsing Hong, Dali (TW); Jerry C C Kuo, Taipei (TW); Michael Joseph Peters, Raleigh, NC (US); Tony T L Tsai, Taipei (TW)

(73) Assignee: International Business Machines Corporation, Armonk, NY (US)

( * ) Notice: Subject to any disclaimer, the term of this patent is extended or adjusted under 35 U.S.C. 154(b) by 961 days.

(21) Appl. No.: 11/770,026

(22) Filed: Jun. 28, 2007

(65) Prior Publication Data

US 2008/0003845 A1    Jan. 3, 2008

(51) Int. Cl.
*G06F 15/177* (2006.01)
(52) U.S. Cl. ......................................................... 713/1
(58) Field of Classification Search .................. 713/1
See application file for complete search history.

(56) References Cited

U.S. PATENT DOCUMENTS

| | | | |
|---|---|---|---|
| 5,138,706 A | | 8/1992 | Melo et al. |
| 5,551,012 A | * | 8/1996 | Chuang et al. ............... 703/27 |
| 5,564,054 A | * | 10/1996 | Bramnick et al. ............ 713/2 |
| 5,974,476 A | * | 10/1999 | Lin et al. ..................... 710/14 |
| 6,101,319 A | * | 8/2000 | Hall ............................. 714/42 |
| 6,427,198 B1 | * | 7/2002 | Berglund et al. ........... 711/170 |
| 7,401,332 B2 | * | 7/2008 | Foster et al. ................ 717/175 |
| 2006/0112397 A1 | | 5/2006 | Raghunandan et al. |

FOREIGN PATENT DOCUMENTS

| | | |
|---|---|---|
| CN | 2526908 | 12/2002 |
| WO | 2006005006 | 1/2006 |

* cited by examiner

*Primary Examiner* — Thomas Lee
*Assistant Examiner* — Eric Chang
(74) *Attorney, Agent, or Firm* — David A. Mims; Robert C. Rolnik

(57) ABSTRACT

Disclosed is a method and circuit board assembly for automatically configuring a circuit board assembly based on installed configuration selection unit. The method comprises reading a feature detection input signal representing a machine model from the installed configuration selection unit; enabling the feature selected by the installed configuration selection unit; reading a machine type number; and determining whether the machine model represented by the feature detection input signal matches the machine type number.

17 Claims, 3 Drawing Sheets

SINGLE SYSTEM BOARD WITH AUTOMATIC FEATURE SELECTION BASED ON INSTALLED CONFIGURATION SELECTION UNIT

CROSS REFERENCE TO RELATED APPLICATIONS

This application claims priority to Taiwan Patent Application No. 95123686 entitled "Single system board with automatic feature selection based on installed configuration selection unit", filed on Jun. 29, 2006, which is incorporated herein by reference and assigned to the assignee herein.

FIELD OF INVENTION

The present invention relates to the field of computer systems, in particular, to a method and apparatus for automatically configuring a circuit board assembly.

BACKGROUND OF THE INVENTION

Terminology:
The following terms will be used throughout the detailed description:

Baseboard management controller (BMC)—a specialized microcontroller embedded on the motherboard of many computers, especially servers. The BMC monitors parameters such as temperature, cooling fan speeds, power mode, operating system (OS) status, etc. of the sensors within a computer, and can send alerts to a system administrator via the network if any of the parameters do not stay within preset limits, indicating a potential failure of the system. There are a firmware and a revision ID included in a BMC.

Serial Attached SCSI (SAS)—a serial communication protocol for computer storage devices, a next generation enterprise level storage interface technology instead of traditional parallel SCSI.

Serial ATA (SATA)—a hard disk interface different from conventional parallel ATA (P-ATA, also called IDE). SATA is named on the basis of data transfer via serial communication instead of the parallel method found in traditional P-ATA.

Small Computer System Interface (SCSI)—a computer standard established from ANNSI (AMERICAN NATIONAL STANDARDS INSTITUTE) for transferring data between devices on internal and external computer bus, which connects a wide range of intellectual computer peripheral devices (such as hard disk drive, optical disk drive) to expanded buses.

Advanced Technology Attachment (ATA)—a standard interface for connecting storage devices such as hard disks and CDROM drives inside PC, also called parallel ATA (P-ATA) or Integrated Drive Electronics (IDE).

Peripheral Component Interconnect (PCI )—a standard local bus for connecting computer motherboard with external peripheral device.

PCI-Extended ( PCI-X) is an extended standard of PCI, which was developed jointly by IBM, HP and Compaq.

PCI-Express ( PCI-E) is a new generation PCI architecture and unlike PCI and PCI-X, which are based on 32-and 64-bit parallel buses, PCI Express uses high-speed serial link technology. PCI Express replaces legacy parallel buses with high-speed serial buses. PCI-E is supported primarily by Intel.

VPD (Vital Product Data) is the manufacturing and part information stored in a nonvolatile memory (e.g. DRAM). Typical VPD contains information such as a part number, a serial number, a product model number, maintenance level, and other information specific to the device type. Vital product data can also include user-defined information. When a system begins a POST (Power-On Self-Test) procedure, POST will show parts of the planar and system component VPD. POST will also track system component VPD on each boot to determine if each device has a valid serial number as well as to alert the user via an event log entry and visible warning message if a device has been changed or removed.

Backplane—Backplane is a circuit board that connects several connectors thereon in parallel to each other. A backplane is generally differentiated from a motherboard by the lack of on-board processing power where the CPU is on a plug-in card. Backplanes are commonly found in disk enclosures, disk arrays, and servers.

Inventory forecasting, inventory management, and stock keeping units (SKUs) management costs are a significant burden to many computer system manufacturers. To satisfy a variety of markets and budgets, many computer system manufacturers offer a wide variety of computer systems for consumers' selection. While such variety makes personal computers available to a wider spectrum of consumers, the same product variety adds complexity to the manufacturing process which, when left unaddressed, may well result in quality and efficiency problems.

In an effort to improve efficiency and alleviate quality problems associated with the circuit board assembly process, many manufacturers have determined that it is more cost effective to settle on a few circuit board assembly "platforms". These platforms are essentially the same, or very similar, circuit board assemblies populated with similar components, wherein the operating features of the circuit board assembly are determined by manually setting strapping devices to configure the configurable devices of the circuit board assembly. This manual setting of the strapping devices selectively configures a circuit board assembly "platform" into a particular genre of circuit board assembly (i.e., a circuit board assembly suitable for a particular use/product). In other words, the selective configuration of strapping devices provide an otherwise generic circuit board assembly with the characteristics (i.e., operating characteristics) commonly associated with a specific product. For example, on computer system motherboards, strapping devices are often used to configure a clock source to supply a particular system bus clock frequency, or to indicate bus/core ratio (i.e., the ratio of the bus clock frequency to the processor clock frequency) configuration information. Jumper blocks, dual-inline package (DIP) switches, double-pole single-throw (DPST) switches are a few examples of strapping devices which are configured to select the operating configuration on a circuit board assembly. Although the concept of the selective configuration of a generic circuit board assembly with strapping devices has indeed improved some of the efficiency problems, they have not eliminated the quality concerns and, in fact, have introduced new quality issues. For example, many of the conventional strapping devices are manually placed on the circuit board assembly in the manufacturing process, which is prone to human error. The misconfiguration of a circuit board assembly (i.e., the configuration of a strapping device which is inconsistent with the operating characteristics of a processor module) may well result in diminished performance or catastrophic failure for the consumer.

The documents, U.S. Pat. Nos. 6,101,319 and 6,434,632, disclose a method and apparatus to automatically configure the configurable devices (i.e., processor modules or clock sources) on a circuit board assembly without utilizing prior art strapping devices. Thus, they provide the upgrade of the circuit board assembly.

The US patent application, No., US 2006/0004928 A1, discloses to select features on integrated circuit devices utilizing the programmable FPD (feature permission designator), FER (feature enable register) and FCD (feature count designator) within an I/O controller (I/O controller hub, ICH). A hardware company could support multiple alternative configurable features on a single physical hardware SKU (stock keeping unit).

Prior art discloses only a mechanism to configure the configurable devices (e.g. a single chip or a processor module itself) of a circuit board and thus provide a generic circuit board assembly. However, these prior arts do not disclose how to provide a generic circuit board assembly for machine type numbers with a wide variety of feature or configuration requirements. For example, IBM xSeries™ servers have three models, respectively as ENT (ENTry model), MID (MiDrange model) and ADV (ADVanced model). ENT model includes two machine type numbers, respectively as 7973 and 7974. MID model also includes two machine type numbers, respectively as 7975 and 7976. Finally, ADV model has only one machine type number, 7977. system model has a specific list of allowed features. Each ENT model is equipped with 8 DIMMs and one Ethernet port. Each MID model is equipped with 8 DIMMs, one Ethernet port and supports SAS hard drives. Finally, ADV model is equipped with 12 DIMMs and 2 Ethernet ports and supports SAS hard drives. Besides, a BMC firmware revision ID for each model is unique, for example, BMC firmware revision IDs for ENT, MID & ADV may be respectively SPE1, SPMT & SPBT. If xSeries servers use different motherboards respectively for different models and machine type numbers, the complexity to the manufacturing process and the inventory management cost will be increased.

Known solutions provide manual jumpers for configuring (disabling) Ethernet or disk drive controller. Similarly, as the manual configuration is required, it is prone to human error.

SUMMARY OF THE INVENTION

The present invention discloses that a single system board is used for system assembly. The enabled/disabled features on the system circuit board are selected by means of a feature detection input (e.g. CABLE PRESENT) which is provided by an external hardware (i.e. cable detect or socket detect) that is added to the system via a normal process of assembly. The system BIOS and/or BMC (baseboard management controller) detect the presence of a feature detection input signal, and enable a function specified by the feature detection input signal. Further checking the machine type number and the firmware version is performed during the system initialization and self test (e.g. a POST, power-on-self-test). If there is any error in the configuration settings, and the error is logged.

Therefore, in accordance with an embodiment of the present invention, the advantage is that a single part can fulfill the inventory for a number of systems, allowing extensive reuse of a single part. Changes in production volumes for different machine type numbers are easier to balance, that is, if actual build volumes do not match the forecast, the system board volume is integrated across a number of different systems. The number of spare parts is shared across multiple systems. The amount of inventory required to support the life of the product is reduced.

An embodiment of the invention provides a method and a circuit board assembly for automatically configuring a circuit board assembly based on installed configuration selection unit.

The method is implemented by:
reading a feature detection input signal representing a machine model from said installed configuration selection unit;
enabling the feature selected by the installed configuration selection unit;
reading a machine type number; and
configuring said circuit board assembly in response to determining whether the machine model represented by the feature detection input signal matches the machine type number.

An embodiment of the present invention also discloses a circuit board assembly, comprising:
a bus coupled to a configuration selection unit, when said configuration selection unit is installed, generating a feature detection input signal to enable a feature selected by the configuration selection unit, and said configuration selection unit being connected to a south bridge to provide said feature detection input signal for POST of a system to determine if the machine model represented by the features detection input signal matches the machine type number stored in a vital product data (VPD) device.

An embodiment of the present invention further provides a computer system, comprising:
a processor;
a north bridge;
a south bridge; and
a bus coupled to a configuration selection unit, when said configuration selection unit is installed, generating a feature detection input signal to enable a feature selected by the configuration selection unit, and said configuration selection unit being connected to said south bridge to provide said feature detection input signal for POST during the system initialization to determine whether the machine model represented by the feature detection input signal matches the machine type number stored in a vital product data (VPD) device.

BRIEF DESCRIPTION OF THE DRAWINGS

In order to further understand of the invention and advantages thereof, the following detailed description of the disclosed embodiment will be considered in conjunction with the accompanying drawings, in which.

DETAILED DESCRIPTION OF THE INVENTION

Figure 1:
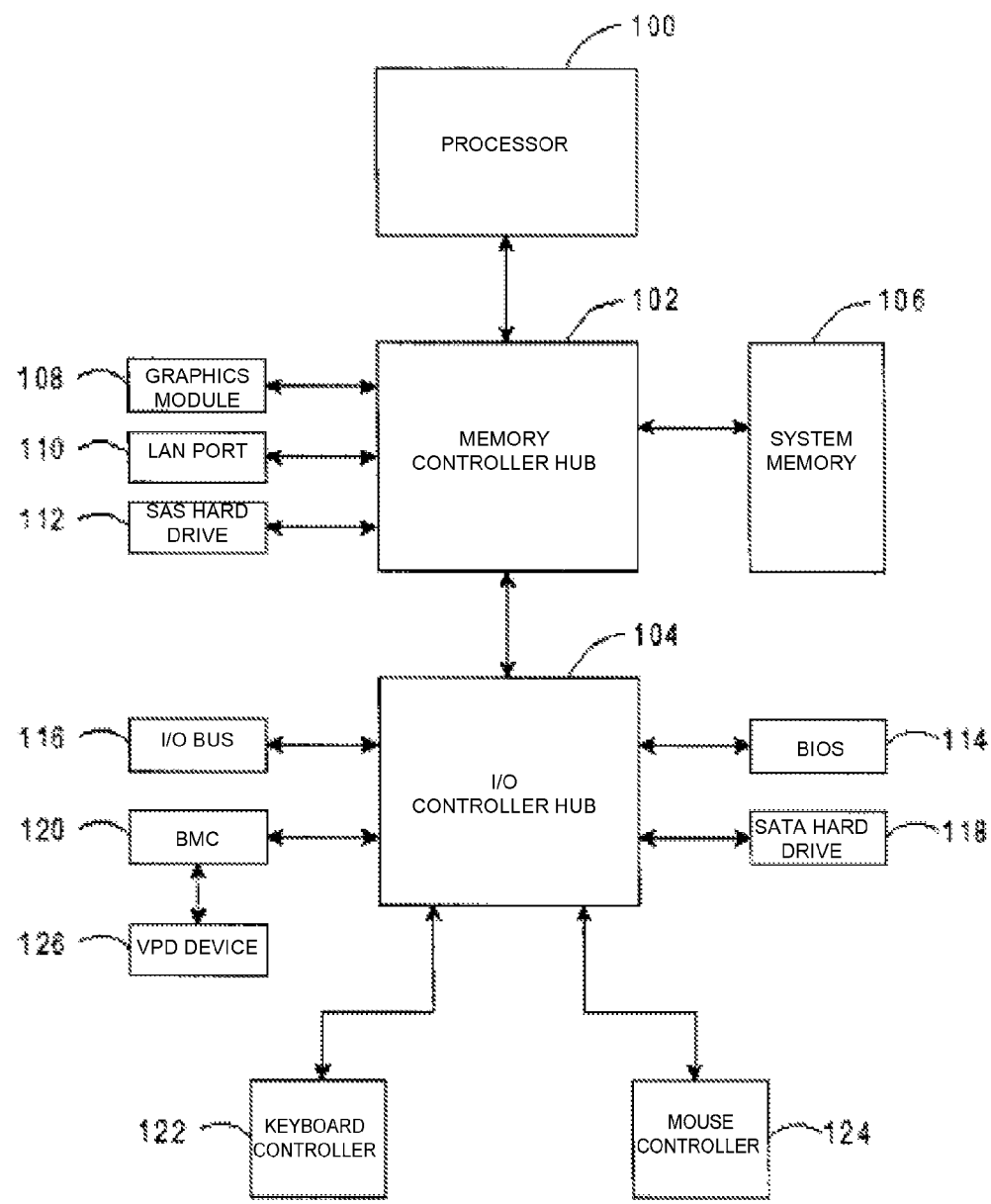
FIG. 1 is a block diagram of one embodiment of a computer system.

The following will describe an embodiment of the present invention. The disclosed embodiment is only for illustration, thus it will be understood by those skilled in the art that there are many modifications and changes made therein without departing from the spirit and scope of the invention. Throughout the appended drawings, like features are identified by like reference numerals.

FIG. 1 is a block diagram of one embodiment of a computer system. The computer system may include a processor 100, a north bridge (e.g. memory controller hub, MCH) 102 and a south bridge (e.g. I/O controller hub, ICH) 104 on a system circuit board (motherboard). The MCH 102 and the ICH 104 may comprise a chipset. The processor 100 may be coupled to the MCH 102 via a host bus. The MCH 102 may be coupled to system memory 106. In different embodiments, a processor may be a multi-processor and system memory may be synchronous dynamic random access memory (SDRAM), double data rate SDRAM (DDR-SDRAM), Rambus DRAM (RDRAM), or one of many other formats of main system memory. The MCH 102 may also be coupled to a graphics module 108, a LAN port 110, or a SAS hard drive 112. In one embodiment, a graphics module may be an accelerated graphics port (AGP) graphics card or PCI-E graphics card.

ICH 104 may be coupled to a BIOS 114, an I/O bus 116, a SATA hard drive 118, a BMC 120, a keyboard controller 122, and a mouse controller 124. In different embodiments, the ICH 104 may also be coupled to any number of I/O devices, buses and/or controllers such as a Redundant Array of Independent Disks (RAID) controller, a Peripheral Component Interface (PCI) bus, PCI-X, PCI-E or a Universal Serial Bus (USB), among many others. The ICH 104 may also have a number of internal features such as internal high definition audio capabilities and power management features for use on mobile platforms to conserve battery life.

Besides, ICH 104 may include a general purpose input (GPI) as a feature detection input for BIOS to determine if a configurable feature on the circuit board will be enabled. According to the embodiment of the present invention, optional features are selected via GPI pin(s). This can be done by cables being plugged into specific sockets or slots. In another embodiment, a Super I/O (not shown) may be coupled to ICH 104. The Super I/O may include GPI pin. In addition, a VPD (vital product data) device 126 may be coupled to a BMC 120 to provide a necessary machine type number.

Figure 2:
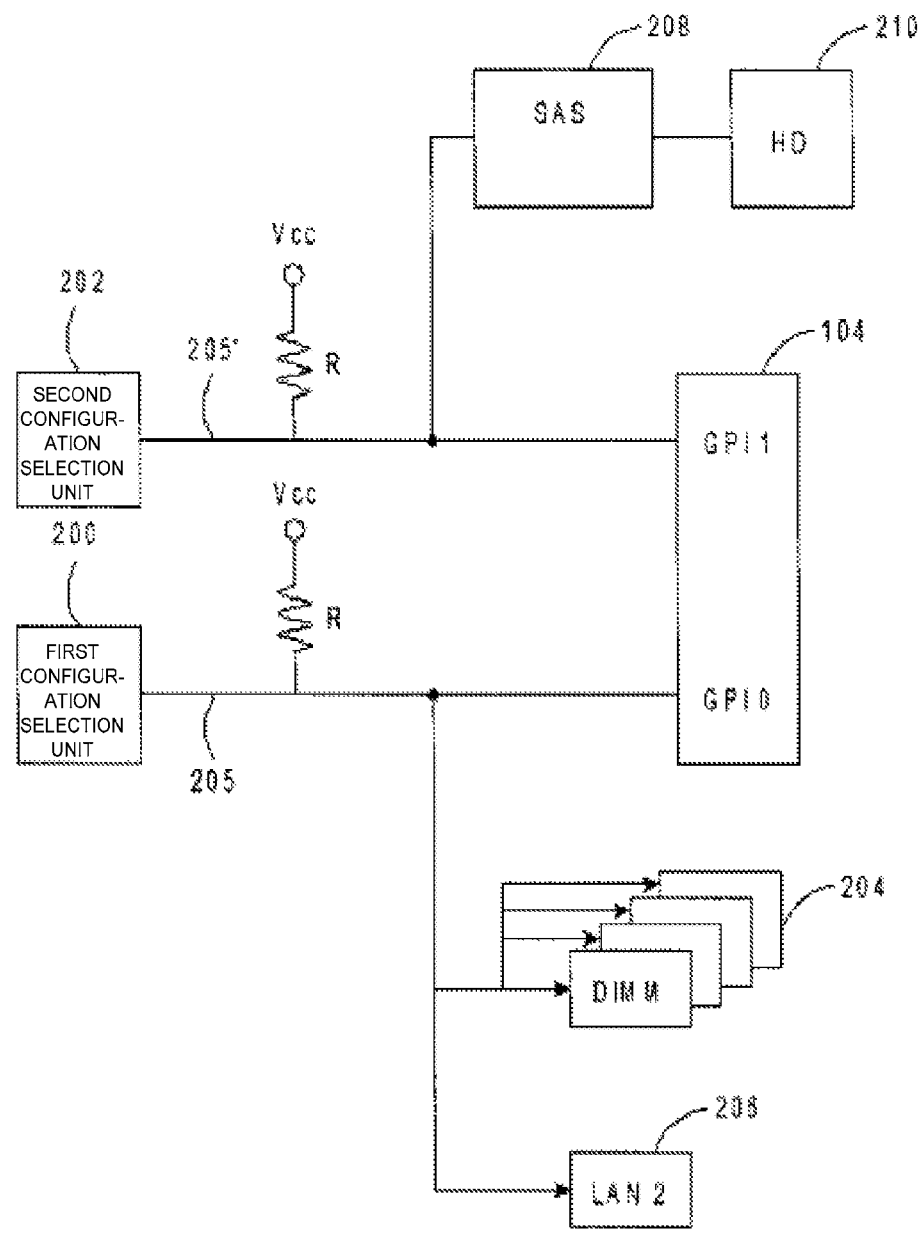
FIG. 2 illustrates a hardware enable mechanism of how to enable features configuration for the different models of IBM xSeries servers mentioned above according an embodiment of the present invention

FIG. 2 illustrates a hardware enable mechanism of how to enable features configuration for the different models of IBM xSeries servers mentioned above according to the present invention. With reference to FIG. 2, two configuration selection units (200, 202) are used as the selection units of hardware configuration of a machine model. When the first configuration selection unit 200 is installed, a CABLE PRESENT enable signal 205 with a logic "0" is generated and sent to 4 additional DIMMs 204 and the second LAN port 206, and thus DIMMs 204 and LAN port 206 are enabled to be an available state. At the same time, the signal 205 is also coupled to GPI0 pin on ICH 104 (or SUPER I/O) for BIOS during boot up (POST) to enable the above features on the system circuit board. The detail of which will be described in more detail with reference to FIG. 3.

On the other hand, when the second configuration selection unit 202 is installed, a CABLE PRESENT enable signal 205' with a logic "0" is generated and sent to SAS controller 208, and thus the SAS controller 208 is enabled to be an available state. At the same time, the signal 205' is also coupled to GPI1 pin for BIOS during boot up (POST) to enable the feature of the SAS controller 208. The SAS controller 208 is connected to a SAS hard drive 210. The relationship between the three models (ADV, MID, ENT) and (GPI0, GPI1 & Enable) is shown in the Table 1. As seen from Table 1, (GPI0, GPI1) may be (0,0) (1,0) and (1,1) which respectively represent models ADV, MID and ENT. The first configuration selection unit 200 may be "Lightpath" diagnostic panel of an external hardware attached to system circuit board via signal cable. The panel may also provide additional LEDs for system diagnostic. The second configuration selection unit 202 may be "SAS backplane" attached to system circuit board via SAS signal cable.

Figure 3:
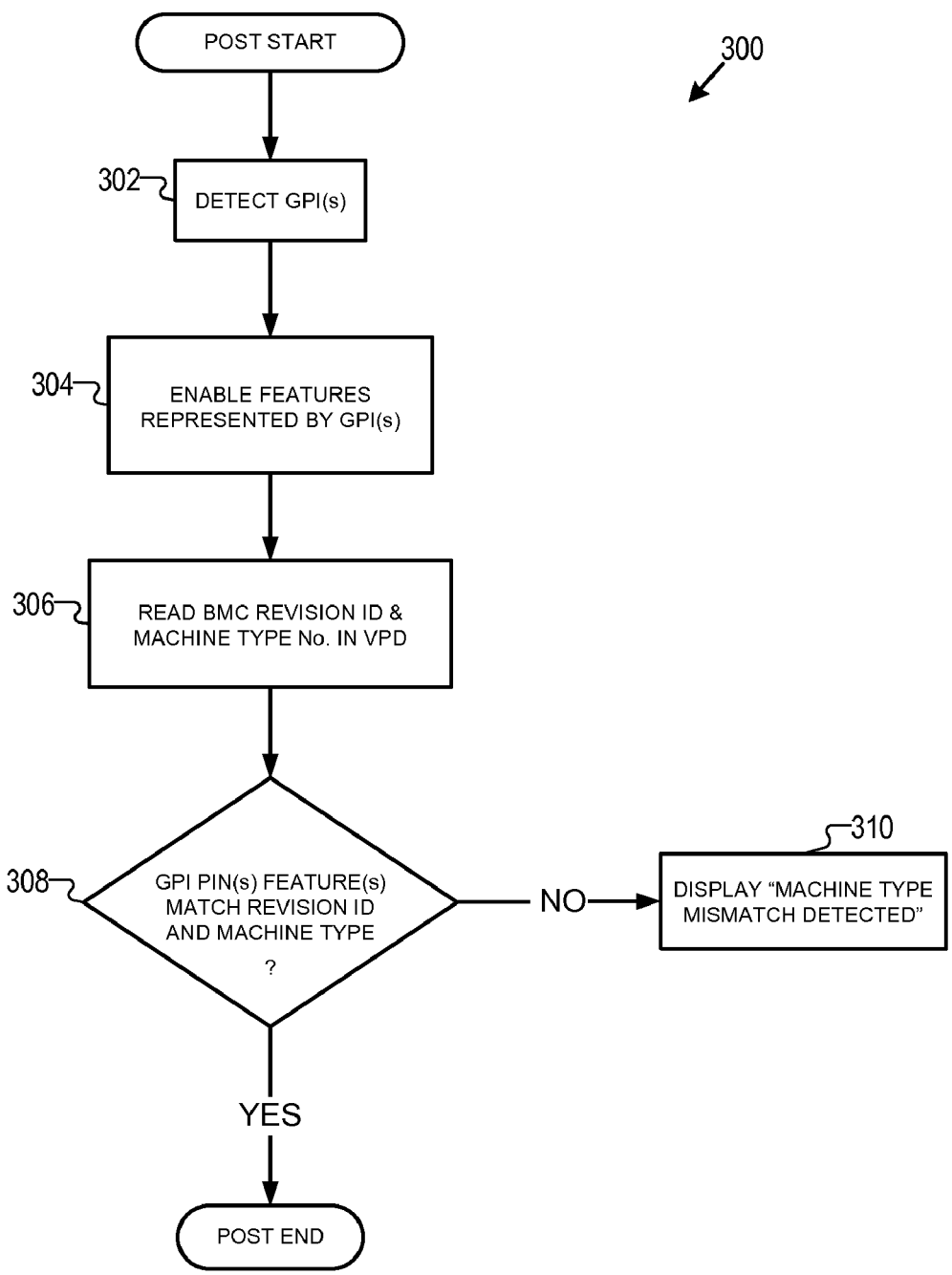
FIG. 3 is a flowchart illustrating a method for automatically configuring a circuit board assembly according to an embodiment of the present invention.

Turning now to FIG. 3, a flowchart illustrating a method 300 for automatically configuring a circuit board assembly is shown. The POST process 300 depicted in FIG. 3 begins with, in step 302, detecting GPI pin(s) each combination of which represents a machine model. In step 304, the features (shown in Table 1) corresponding to a detected combination of GPI pin(s) representing a machine model are enabled. In step 306, BMC firmware revision ID and machine type number stored in a VPD device are read. As mentioned above, for example, BMC firmware revision IDs for three models of IBM xSeries servers, ENT, MID & ADV, are respectively SPE1, SPMT & SPBT, while the machine type numbers stored in the VPD devices are respectively 7973&7974, 7975&7976, and 7977.

In step 308, a determination is made as to whether the hardware features of the machine model represented by GPI pin(s) match the BMC firmware revision ID and the machine type number. If they all match, there is no error, the POST is ended. If any of them mismatch, go to step 310 to display an error warning message, such as "Machine Type mismatch detected", to an user. It means that the system circuit board is not configured properly, and needs to be re-configured. Accordingly, the object of the present invention can be achieved by utilizing a single system circuit board for a widely variety of system models. A single system board will be used across all 5 machine types, 7973, 7974, 7975, 7976 & 7977 in accordance with the present invention.

Shown in the embodiment mentioned above, the machine type number stored in a VPD device is used to confirm the proper hardware configuration and firmware configuration. In fact, according to an embodiment of the present invention, the system can only confirm the hardware configuration, or further check that the error configuration is come from hardware configuration or firmware configuration. For example, a determination as to whether the machine type number matches the hardware features of the machine model represented by GPI pin(s) and a determination as to whether the machine type number matches the firmware revision ID are separately made. Besides, if each model has a different BIOS version, a determination is made as to whether the model matches the BIOS version.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses, where used, are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method of automatically configuring a circuit board assembly based on installed configuration selection unit, comprising:
    reading a feature detection input signal representing a machine model from said installed configuration selection unit;
    enabling the feature selected by the installed configuration selection unit, responsive to reading an enabling signal within the feature detection input signal;
    reading a machine type number from a vital product data (VPD) device; and
    configuring said system board assembly in response to determining whether the machine model represented by the feature detection input signal matches the machine type number.

2. The method of claim 1, wherein a system board assembly connects to a baseboard management controller (BMC) with a revision ID.

3. The method of claim 2, wherein the revision ID of said BMC is provided for further determining whether the revision ID of said BMC matches the machine type number.

4. The method of claim 2, wherein the revision ID of said BMC is provided for further determining whether the revision ID of said BMC matches the machine model represented by the feature detection input signal.

5. The method of claim 1, wherein the machine type number is stored in the VPD device along with a second machine type number, the VPD device physically attached to the circuit board assembly.

6. The computer implemented method of claim 5, wherein the machine type is one selected from the group consisting of 7973, 7974, 7975, 7976, and 7977.

7. The firmware with a program embedded thereon, the program comprising program code means causing a data processing system to execute a method for automatically configuring a circuit board assembly according to claim 1.

8. The computer implemented method of claim 1, further comprising:
    initial reading the machine type number, prior to the reading of the machine type number; and
    initial configuring the system by directing a user to re-configure the system board assembly.

9. A circuit board assembly, comprising:
    a bus coupled to a configuration selection unit, when said configuration selection unit is installed, generating a feature detection input signal to at least two general purpose inputs from a baseboard management controller (BMC) to enable a feature selected by the configuration selection unit, and said configuration selection unit being connected to a south bridge to provide said feature detection input signal for power-on self test of a system to determine whether a machine model represented by the feature detection input signal matches a machine type number stored in a memory, wherein the BMC stores a revision ID.

10. The circuit board assembly of claim 9, wherein the revision ID of said BMC is provided for further determining whether the revision ID of said BMC matches the machine type number.

11. The circuit board assembly of claim 9, wherein the revision ID of said BMC is provided for further determining whether the revision ID of said BMC matches the machine model represented by the feature detection input signal.

12. The circuit board assembly of claim 9, wherein the machine type number is stored in a vital product data (VPD) device.

13. A computer system, comprising:
    a processor;
    a north bridge;
    a south bridge; and
    a bus coupled to a configuration selection unit,
    when said configuration selection unit is installed, generating a feature detection input signal from at least two general purpose inputs to enable a feature selected by the configuration selection unit, and said configuration selection unit being connected to said south bridge to provide said feature detection input signal for power-on self-test during system initialization to determine whether a machine model represented by the feature detection input signal matches a machine type number stored in a memory.

14. The computer system of claim 13, further comprising a baseboard management controller (BMC) with a revision ID.

15. The computer system of claim 14, wherein the revision ID of said BMC is provided for further determining whether the revision ID of said BMC matches the machine type number.

16. The computer system of claim 14, wherein the revision ID of said BMC is provided for further determining whether the revision ID of said BMC matches the machine model represented by the feature detection input signal.

17. The computer system of claim 13, wherein the machine type number is stored in a vital product data (VPD) device.

* * * * *